(12) United States Patent
Hentges et al.

(10) Patent No.: US 8,144,430 B2
(45) Date of Patent: Mar. 27, 2012

(54) MULTI-LAYER GROUND PLANE STRUCTURES FOR INTEGRATED LEAD SUSPENSIONS

(75) Inventors: Reed T. Hentges, Buffalo, MN (US); Kurt C. Swanson, Hutchinson, MN (US); Peter F. Ladwig, Hutchinson, MN (US)

(73) Assignee: Hutchinson Technology Incorporated, Hutchinson, MN (US)

( * ) Notice: Subject to any disclaimer, the term of this patent is extended or adjusted under 35 U.S.C. 154(b) by 0 days.

(21) Appl. No.: 12/901,771

(22) Filed: Oct. 11, 2010

(65) Prior Publication Data

US 2011/0026166 A1 Feb. 3, 2011

Related U.S. Application Data

(62) Division of application No. 11/548,177, filed on Oct. 10, 2006, now Pat. No. 7,832,082.

(51) Int. Cl.
*G11B 5/127* (2006.01)
(52) U.S. Cl. .................................................. 360/245.9
(58) Field of Classification Search .................... None
See application file for complete search history.

(56) References Cited

U.S. PATENT DOCUMENTS

| | | | |
|---|---|---|---|
| 5,608,591 A | 3/1997 | Klaassen | |
| 5,651,723 A | 7/1997 | Bjornard et al. | |
| 5,694,270 A | 12/1997 | Sone et al. | |
| 5,737,152 A | 4/1998 | Balakrishnan | |
| 5,796,552 A | 8/1998 | Akin, Jr. et al. | |
| 5,812,344 A | 9/1998 | Balakrishnan | |
| 5,857,257 A | 1/1999 | Inaba | |
| 5,862,010 A | 1/1999 | Simmons et al. | |
| 5,995,328 A | 11/1999 | Balakrishnan | |
| 5,995,329 A | 11/1999 | Shiraishi et al. | |
| 6,480,359 B1 | 11/2002 | Dunn et al. | |
| 6,704,165 B2 * | 3/2004 | Kube et al. | 360/245.9 |
| 6,735,052 B2 | 5/2004 | Dunn et al. | |
| 6,762,913 B1 | 7/2004 | Even et al. | |
| 6,797,888 B2 | 9/2004 | Ookawa et al. | |
| 6,882,506 B2 | 4/2005 | Yamaoka et al. | |
| 6,891,700 B2 * | 5/2005 | Shiraishi et al. | 360/245.9 |
| 6,900,967 B1 * | 5/2005 | Coon et al. | 360/245.9 |
| 7,079,357 B1 * | 7/2006 | Kulangara et al. | 360/245.9 |
| 7,099,117 B1 * | 8/2006 | Subrahmanyam et al. | 360/245.9 |
| 7,129,418 B2 | 10/2006 | Aonuma et al. | |
| 7,142,395 B2 | 11/2006 | Swanson et al. | |
| 7,158,348 B2 | 1/2007 | Erpelding et al. | |
| 7,161,767 B2 | 1/2007 | Hernandez et al. | |
| 7,388,733 B2 * | 6/2008 | Swanson et al. | 360/245.9 |
| 7,403,357 B1 * | 7/2008 | Williams | 360/245.9 |

(Continued)

*Primary Examiner* — Mark Blouin
(74) *Attorney, Agent, or Firm* — Faegre Baker Daniels LLP

(57) ABSTRACT

Multi-layer ground plane structures and methods of manufacture for integrated lead suspension flexures. A flexure in accordance with one embodiment of the invention includes an insulating layer, a plurality of traces on the insulating layer and a stainless steel base layer on the side of the insulating layer opposite the traces. The stainless steel base layer includes one or more void portions with voids in the base layer opposite the insulating layer from the traces and one or more backed portions with the base layer backing the traces. A plurality of first conductive ground planes are located between the stainless steel base layer and the insulating layer opposite the insulating layer from the traces at the backed portions of the stainless steel base layer. A continuous second conductive ground plane is located opposite the insulating layer from the traces at the void portions and backed portions of the stainless steel base layer.

9 Claims, 11 Drawing Sheets

U.S. PATENT DOCUMENTS

| | | | |
|---|---|---|---|
| 7,697,237 B1 * | 4/2010 | Danielson | 360/245.9 |
| 7,710,688 B1 * | 5/2010 | Hentges et al. | 360/245.9 |
| 7,804,663 B2 | 9/2010 | Hirano et al. | |
| 7,826,177 B1 * | 11/2010 | Zhang et al. | 360/245.3 |
| 7,832,082 B1 | 11/2010 | Hentges et al. | |
| 2004/0181932 A1 | 9/2004 | Yao et al. | |
| 2004/0264056 A1 | 12/2004 | Jang et al. | |
| 2005/0117257 A1 | 6/2005 | Thaveeprungsriporn et al. | |

* cited by examiner

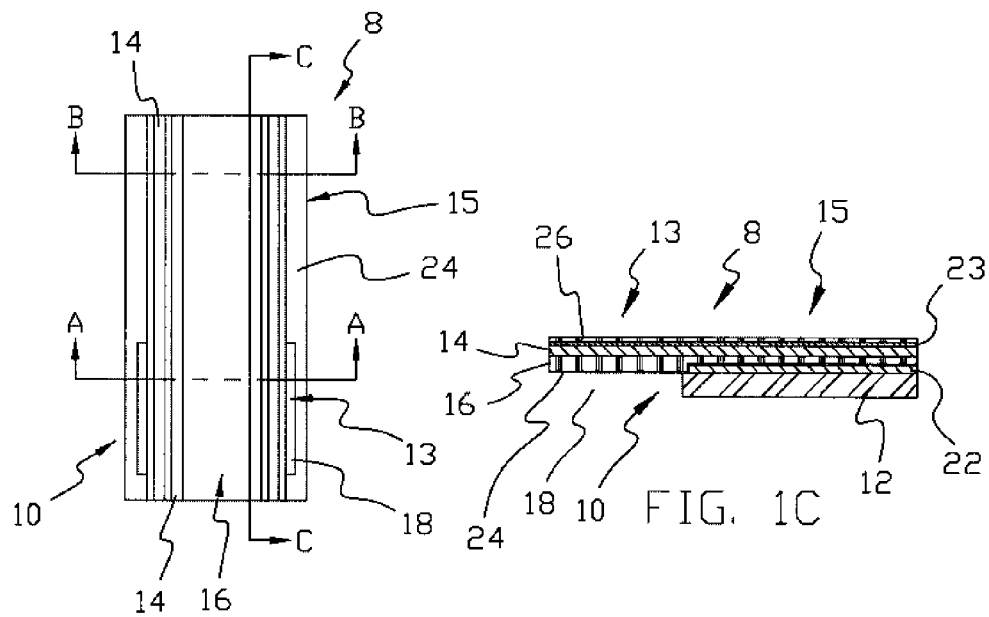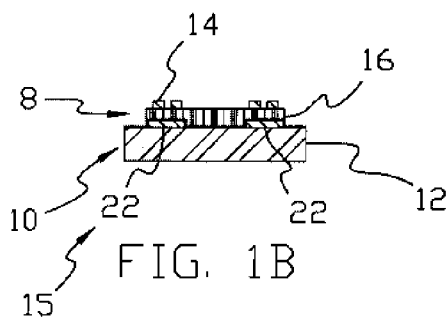

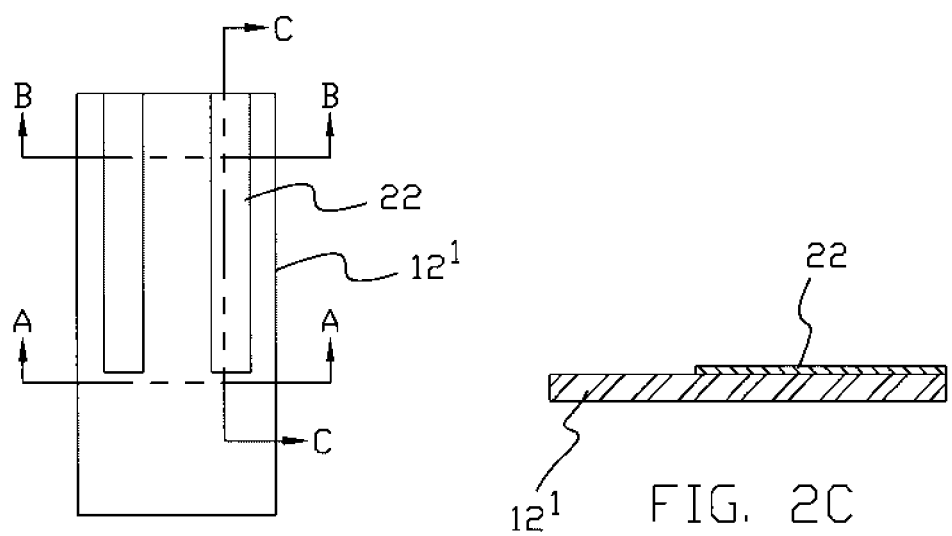
FIG. 2
FIG. 2C
FIG. 2A
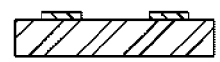
FIG. 2B

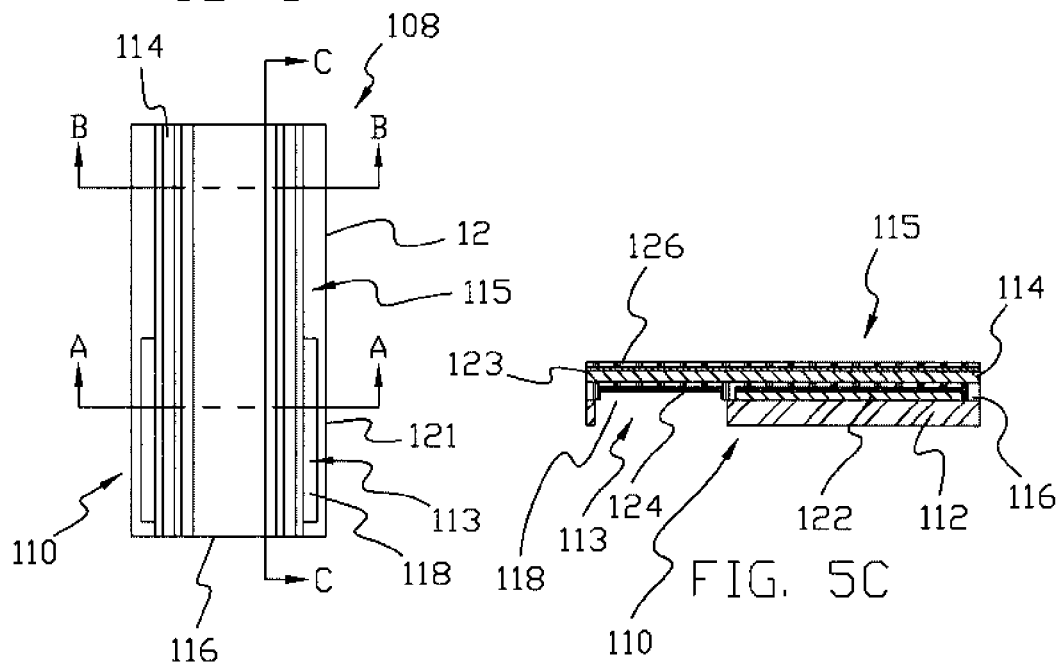
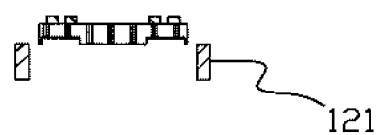
FIG. 5
FIG. 5C
FIG. 5A
FIG. 5B

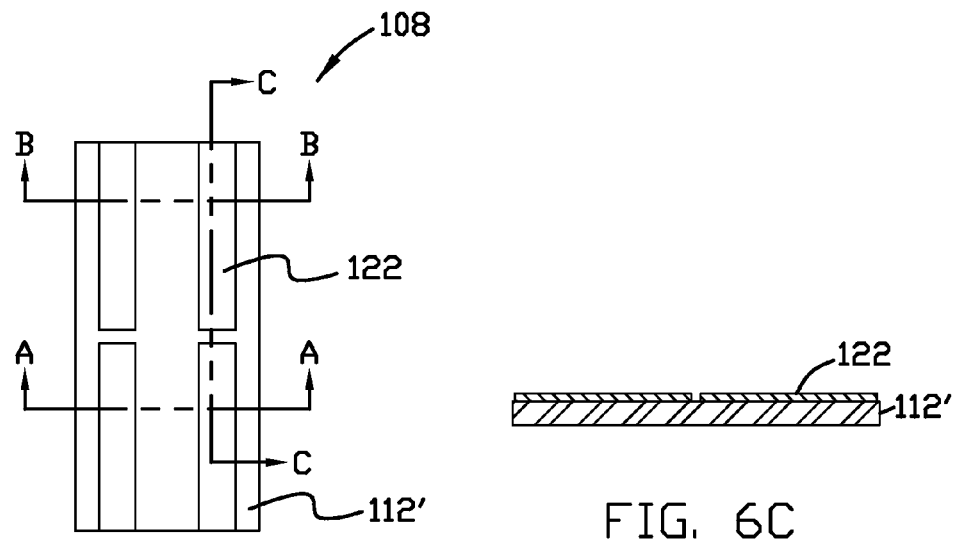
FIG. 6
FIG. 6C
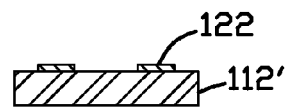
FIG. 6A
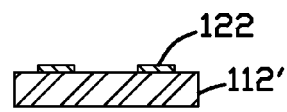
FIG. 6B

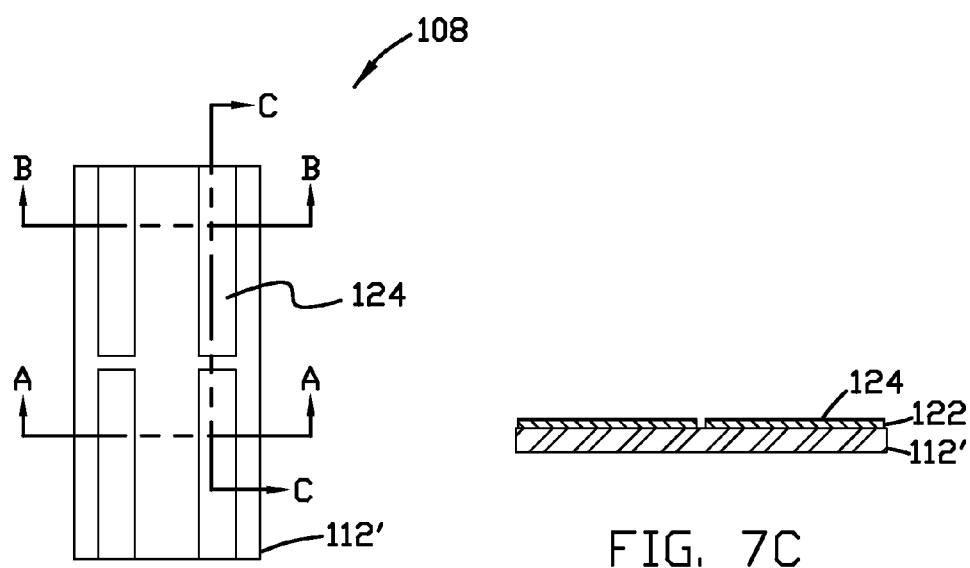
FIG. 7
FIG. 7C
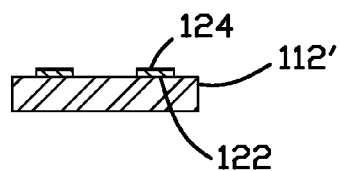
FIG. 7A
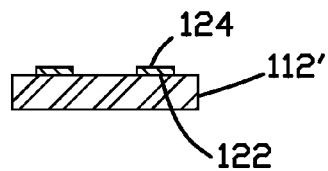
FIG. 7B

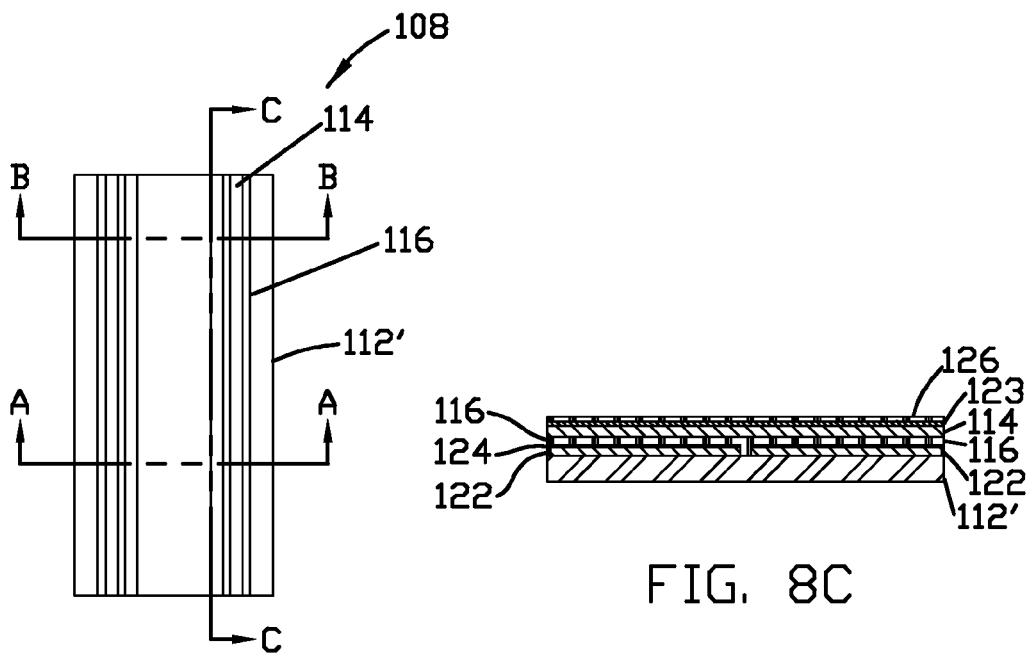
FIG. 8
FIG. 8C
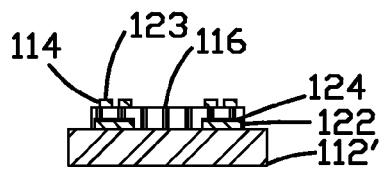
FIG. 8A
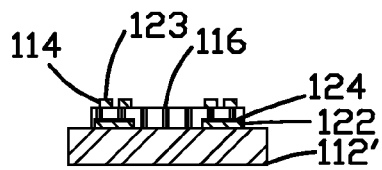
FIG. 8B

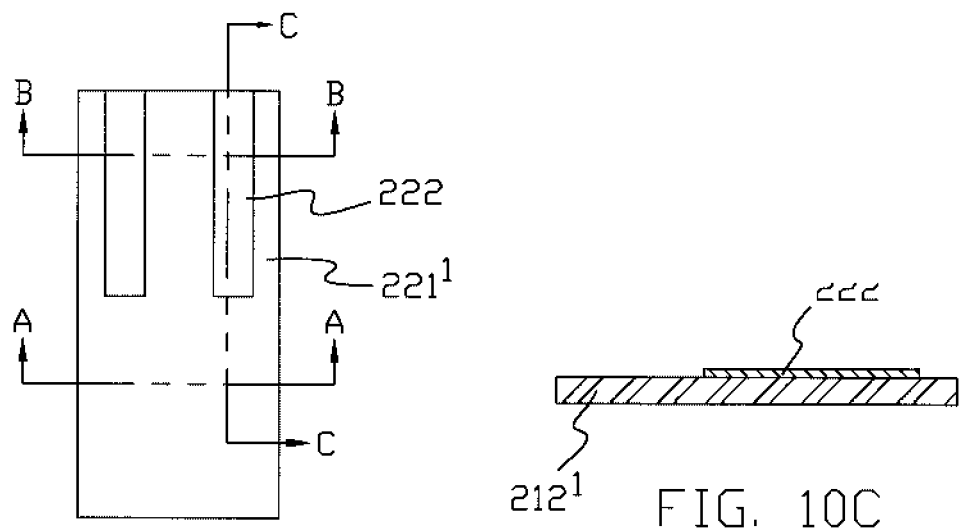
FIG. 10
FIG. 10C
FIG. 10A
FIG. 10B

MULTI-LAYER GROUND PLANE STRUCTURES FOR INTEGRATED LEAD SUSPENSIONS

CROSS-REFERENCE TO RELATED APPLICATION

This application is a division of U.S. patent application Ser. No. 11/548,177, filed Oct. 10, 2006, entitled Multi-Layer Ground Plane Structures For Integrated Lead Suspensions, which application is incorporated herein by reference in its entirety and for all purposes.

FIELD OF THE INVENTION

The invention relates generally to integrated lead suspensions used in disk drives. In particular, the invention is a multiple-layer, high conductivity ground plane structure for an integrated lead suspension

BACKGROUND OF THE INVENTION

Integrated lead or wireless suspensions used to support the sliders and read/write heads in magnetic disk drives are well known and disclosed, for example, in the Akin, Jr. et al. U.S. Pat. No. 5,796,552 and the Shiraishi et al. U.S. Pat. No. 6,891,700. These devices typically include a flexure mounted to a stainless steel load beam. The flexure typically includes a stainless steel base with a plurality of conductive leads or traces extending between terminal pads on the opposite ends of the device. A layer of polyimide or other insulating material separates the traces from the underlying stainless steel base. Subtractive and additive processes can be used to manufacture these devices. Subtractive manufacturing methods use photolithography and etching processes to form the flexure from laminated material stock having a layer of stainless steel and a layer of conductive material separated by an insulating layer. Additive manufacturing methods use photolithography, deposition and etching processes to add the insulating layer, traces and other structures to a stainless steel base.

The stainless steel layer of the flexure acts as a ground plane for the traces. Because the dielectric layer is usually relatively thin, the traces and ground plane can be coupled. These electrical characteristics can reduce the signal performance characteristics of the traces, especially at high signal frequencies. Approaches for compensating for the impact of the stainless steel layer on the signal performance characteristics are known. For example, the Shiraishi et al. U.S. Pat. No. 6,891,700 discloses holes below the traces through the stainless steel layer of the flexure to lower parasitic capacitance. The Akin, Jr. et al. U.S. Pat. No. 5,796,552 discloses an embodiment having a shield formed by electro-deposition of a metallic film against the dielectric layer below the traces and a conductor shield over the traces.

There remains, however, a continuing need for integrated lead structures providing improved signal performance. To be commercially viable any such structures must be capable of being efficiently manufactured.

SUMMARY OF THE INVENTION

One embodiment of the present invention is an improved method for manufacturing an integrated lead suspension component such as a flexure having high-quality signal performance. The method includes: (1) forming one or more first conductive ground planes on a stainless steel base layer; (2) forming one or more second conductive ground planes, including portions on the surface of the first conductive ground planes, at void portions and backed portions of the stainless steel base layer, the material of the second conductive ground planes being non-reactive to a first etchant; (3) forming an insulating layer on the second ground planes on the side opposite the stainless steel base layer and on the stainless steel base layer; (4) forming traces on the insulating layer; and (5) forming voids in void portions of the stainless steel base layer using the first etchant and the second conductive ground planes at the void portions as etch stops.

In another embodiment of the invention forming the one or more first conductive ground planes includes forming first conductive ground planes at void portions of the stainless steel base layer, with the material of the first conductive ground planes being reactive to the first etchant. In this embodiment the step of forming voids includes etching the first conductive ground planes at the void portions using the first etchant.

BRIEF DESCRIPTION OF THE DRAWINGS

FIG. 1 is a top plan view of a portion of an integrated lead flexure in accordance with one embodiment of the present invention.

FIGS. 1A, 1B and 1C are cross sectional views of the integrated lead flexure shown in FIG. 1, taken at section lines A-A, B-B and C-C in FIG. 1, respectively.

FIG. 2 is a top plan view of a portion of the integrated lead flexure portion shown in FIG. 1 during its manufacture in accordance with one embodiment of the invention.

FIGS. 2A, 2B and 2C are cross sectional views of the integrated lead flexure portion shown in FIG. 2, taken at section lines A-A, B-B and C-C in FIG. 2, respectively.

FIG. 5 is a top plan view of a portion of an integrated lead flexure in accordance with a second embodiment of the present invention.

FIGS. 5A, 5B and 5C are cross sectional views of the integrated lead flexure shown in FIG. 5, taken at section lines A-A, B-B and C-C in FIG. 5, respectively.

FIG. 6 is a top plan view of a portion of the integrated lead flexure portion shown in FIG. 5 during its manufacture in accordance with one embodiment of the invention.

FIGS. 6A, 6B and 6C are cross sectional views of the integrated lead flexure portion shown in FIG. 6, taken at section lines A-A, B-B and C-C in FIG. 6, respectively.

FIG. 7 is a top plan view of the integrated lead flexure portion shown in FIG. 6 following additional manufacturing steps in accordance with one embodiment of the invention.

FIGS. 7A, 7B and 7C are cross sectional views of the integrated lead flexure portion shown in FIG. 7, taken at section lines A-A, B-B and C-C in FIG. 7, respectively.

FIG. 8 is a top plan view of the integrated lead flexure portion shown in FIG. 7 following yet additional manufacturing steps in accordance with one embodiment of the invention.

FIGS. 8A, 8B and 8C are cross sectional views of the integrated lead flexure portion shown in FIG. 8, taken at section lines A-A, B-B and C-C in FIG. 8, respectively.

FIGS. 9A, 9B and 9C are cross sectional views of the integrated lead flexure portion shown in FIG. 9, taken at section lines A-A, B-B and C-C in FIG. 9, respectively.

FIG. 10 is a top plan view of a portion of the integrated lead flexure portion shown in FIG. 9 during its manufacture in accordance with one embodiment of the invention.

FIGS. 10A, 10B and 10C are cross sectional views of the integrated lead flexure portion shown in FIG. 10, taken at section lines A-A, B-B and C-C in FIG. 10, respectively.

DETAILED DESCRIPTION OF THE PREFERRED EMBODIMENTS

Figure 3:
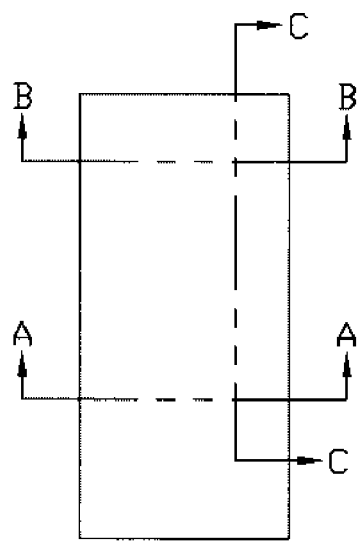
FIG. 3 is a top plan view of the integrated lead flexure portion shown in FIG. 2 following additional manufacturing steps in accordance with one embodiment of the invention.
Figure 3C:
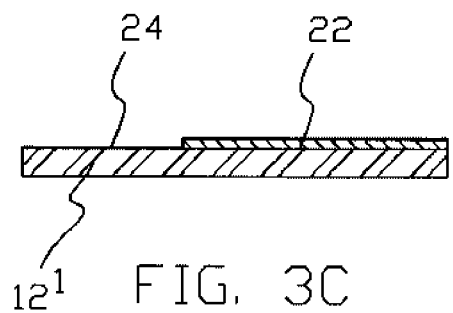
FIGS. 3A, 3B and 3C are cross sectional views of the integrated lead flexure portion shown in FIG. 3, taken at section lines A-A, B-B and C-C in FIG. 3, respectively.
Figure 3A:
Figure 3B:
Figure 4:
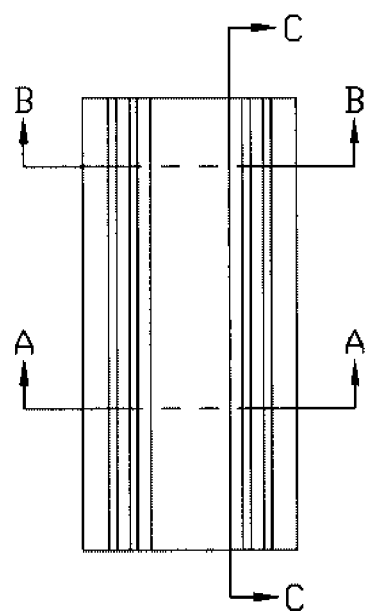
FIG. 4 is a top plan view of the integrated lead flexure portion shown in FIG. 3 following yet additional manufacturing steps in accordance with one embodiment of the invention.
Figure 4C:
FIGS. 4A, 4B and 4C are cross sectional views of the integrated lead flexure portion shown in FIG. 4, taken at section lines A-A, B-B and C-C in FIG. 4, respectively.
Figure 4A:
Figure 4B:

FIG. 1 is a top view of a portion of an integrated lead flexure 8 (i.e., a suspension component) having a multiple layer, high conductivity ground plane structure 10 in accordance with one embodiment of the invention. FIGS. 1A, 1B and 1C are sectional views of the flexure 8 taken at lines A-A, B-B and C-C, respectively in FIG. 1. As shown, flexure 8 includes a stainless steel base layer 12, a plurality of leads or traces 14 and a dielectric or insulating layer 16 separating the traces from the base layer. The traces 14 extend between terminal pads (not shown) on the opposite ends of the flexure 8. The illustrated embodiment of flexure 8 has four traces 14 that are arranged in two groups of two traces each. As shown in FIG. 1C (but not in FIG. 1, 1A or 1B), a conductive plating layer 23 can be applied over the surfaces of the traces 14 extending from the insulating layer 16. A dielectric cover layer 26 can also be applied over the plated traces 14 and optionally over the insulating layer 16. Flexure 8 is configured to be mounted to a stainless steel or other conventional load beam in a conventional manner.

One or more portions 15 of the flexure 8 have stainless steel base layer 12 below or backing the traces 14. One or more portions 13 of the flexure 8 (one is shown in FIGS. 1 and 1A-1C) have windows or voids 18 in the base layer 12 below portions of the traces 14. Voids 18 extend through the base layer 12. In the illustrated embodiment, void 18 is located between the outer edge portions 21 of the base layer 12. In other embodiments (not shown) voids 18 extend across the full width of the flexure 8, and no edge portions such as 21 remain. Voids 18 can be one of several "windows" in the flexure 8 (such as the holes in the Shiraishi et al. U.S. Pat. No. 6,891,700), or can extend for any desired length between the terminal pads (not shown) on the opposite ends of the traces, including on the gimbal region and tail of the flexure (not shown). Portions of the base layer 12 will remain to allow the flexure 8 to be welded or otherwise attached to a load beam (not shown).

Ground plane structure 10 includes patterned first conductive ground planes 22 on the stainless steel-backed portions 15 and a continuous second ground plane 24 over both the stainless steel backed portions 15 and the stainless steel void portions 13. The first conductive ground plane 22 is located on the stainless steel base layer 12, below the traces 14 and insulating layer 16, on the portions of the flexure 8 that do not have voids 18 in the base layer. The illustrated embodiment includes two transversely spaced first conductive ground planes 22, one below each of the two sets of traces 14. The second high conductivity ground plane 24 is located: (1) directly over the base layer 12 on those portions of the base layer that are not below a first conductive ground plane 22 (i.e., between the base layer 12 and the insulating layer 16), (2) on the base layer for the portions of the base layer that are not covered by the insulating layer, (3) directly over the first conductive ground plane 22 at locations where the first ground plane 22 is present (i.e., between the first conductive ground plane 22 and the insulating layer 16), and (4) on the surface of the insulating layer opposite the insulating layer surface with the traces 14 at the portions of the flexure where there are voids 18 in the stainless steel base layer 12.

FIGS. 2, 2A-2C, 3, 3A-3C and 4, 4A-4C illustrate an additive process by which the flexure 8 can be fabricated. As shown in FIGS. 2 and 2A-2C, the first conductive ground planes 22 are formed at desired locations on stainless steel stock 12'. The ground planes are formed from copper or copper alloy in one embodiment. Other conductive metals or other materials are used in other embodiments. Photolithography and electroplating processes are used to form the first ground planes 22 in one embodiment. Other processes such as sputtering or vapor deposition are used in other embodiments.

The second ground plane 24 is then formed over the stainless steel stock 12' and the first ground planes 22 as shown in FIGS. 3 and 3A-3C. In one embodiment of the invention the second ground plane 24 is a layer of gold that is sputtered onto the surfaces of the stainless steel stock 12' and first ground planes 22. In the embodiment of the invention illustrated in FIGS. 3 and 3A-3C, the second ground plane 24 is sputtered onto the entire surface of the stainless steel stock 12' and first ground planes 22. In other embodiments the second ground plane can be applied in desired patterns over only selected portions of the stainless steel stock 12' and/or first ground planes 22. Photolithography and other processes such as electroplating can also be used to form and optionally pattern the second ground plane 24.

Insulating layer 16 can be formed over the second ground plane 24 and any exposed portions of stainless steel stock 12' as shown in FIGS. 4 and 4A-4C. In one embodiment of the invention the insulating layer 16 is formed by coating, curing and patterning a polyimide precursor. Other materials and processes are used in other embodiments. In the illustrated embodiment the insulating layer 16 extends across a width of the flexure 8 spanning both of the first ground planes 22 and the area between the first ground planes, but not the full width of the stainless steel stock 12'. In other embodiments (not shown), the insulating layer can take other configurations. Other processes can also be used to form the insulating layer 16.

Traces 14 are formed on the insulating layer 16. In one embodiment of the invention a seed layer of conductive material is sputtered onto the insulating layer 16 and patterned using photolithography and etching processes. The traces 14 are then electroplated onto the seed layer. Any conductive plating layer such as 23 (FIG. 1C) can then be plated onto the traces 14. Photolithography and other processes such as vapor deposition and chemical etching can also be used to form the traces 14 on the insulating layer 16. Cover layer 26 (FIG. 1C) can be formed over the traces 14 using materials and processes such as those described above for forming the insulating layer 16.

Voids 18 and other structures in the stainless steel base layer 12 of flexure 8 are formed from the stainless steel stock by photolithography and etching processes in one embodiment of the invention. By way of example, a mask (not shown) corresponding to the patterns of voids 18 can be formed on the side of stainless steel stock 12' opposite the insulating layer 16, and the stainless steel stock exposed to a chemical etchant. In one embodiment of the invention, the etchant used to remove the stainless steel stock 12' at voids 18 is not reactive to the material used for the second ground plane 24. In these embodiments the second ground plane 24 can be used as an etch stop during the manufacture of flexure 8, thereby enhancing the efficiency of the manufacturing process. In the embodiment described above that has a gold second ground plane 24, for example, the ground plane will function as an etch stop for an etching process using FeCl acid to form voids 18.

FIG. 5 is a top view of a portion of an integrated lead flexure 108 having a multiple layer, high conductivity ground plane structure 110 in accordance with another embodiment of the invention. FIGS. 5A, 5B and 5C are sectional views of the flexure 108 taken at lines A-A, B-B and C-C, respectively in FIG. 5. As shown, flexure 108 includes a stainless steel base layer 112, a plurality of leads or traces 114 and a dielectric or insulating layer 116 separating the traces from the base layer. The traces 114 extend between terminal pads (not shown) on the opposite ends of the flexure 108. The illustrated embodiment of flexure 108 has four traces 114 that are arranged in two groups of two traces each. As shown in FIG. 5C (but not in FIG. 5, 5A or 5B), a conductive plating layer 123 can be applied over the surfaces of the traces 114 extending from the insulating layer 116. A dielectric cover layer 126 can also be applied over the plated traces 114 and optionally over the insulating layer 116. Flexure 108 is configured to be mounted to a stainless steel or other conventional load beam (not shown) in a conventional manner.

One or more portions 115 of the flexure 108 have the stainless steel base layer 112 below or backing the traces 114. One or more portions 113 of the flexure 108 (one is shown in FIGS. 5 and 5A-5C) have windows or voids 118 in the base layer 112 below portions of the traces 114. Voids 118 extend through the base layer 112. In the illustrated embodiment, void 118 is located between the outer edge portions 121 of the base layer 112. In other embodiments (not shown) voids 118 extend across the full width of the flexure 108, and no edge portions such as 121 remain. Voids 118 can be one of several "windows" in the flexure 108 (such as the holes in the Shiraishi et al. U.S. Pat. No. 6,891,700), or can extend for any desired length between the terminal pads (not shown) on the opposite ends of the traces, including on the gimbal region and tail of the flexure (not shown). Portions of the base layer 112 will remain to allow the flexure 108 to be welded or otherwise attached to a load beam (not shown).

Ground plane structure 110 includes patterned first conductive ground planes 122 on the stainless steel-backed portions 115 and patterned second ground planes 124 over both the stainless steel backed portions 115 and the stainless steel void portions 113. The first conductive ground planes 122 are located on the stainless steel base layer 112, below the traces 114 and insulating layer 116, on the portions of the flexure 108 that do not have voids 118 in the base layer. The illustrated embodiment includes two transversely spaced first conductive ground planes 122, one below each of the two sets of traces 114. The second high conductivity ground plane 124 is located: (1) over the first ground planes 122, and (2) below the traces 114 at the stainless steel void portions 113 (between the stainless steel voids 113 and the insulating layer 116).

FIGS. 6, 6A-6C, 7, 7A-7C and 8, 8A-8C illustrate an additive process by which the flexure 108 can be fabricated. As shown in FIGS. 6 and 6A-6C, the first conductive ground planes 122 are formed at desired locations on stainless steel stock 112'. The ground planes 122 are formed from copper or copper alloy in one embodiment. Other conductive metals or other materials are used in other embodiments. Photolithography and electroplating processes are used to form the first ground planes 122 in one embodiment. Other processes such as sputtering or vapor deposition are used in other embodiments. As described below, portions of the ground planes 122 formed during this manufacturing step at stainless steel void portions 113 will be removed during subsequent manufacturing steps.

The second ground planes 124 are then formed over the first ground planes 122 as shown in FIGS. 7 and 7A-7C. In one embodiment of the invention the second ground planes 124 are a layer of gold that is electroplated onto the surfaces of the first ground planes 122. In the embodiment shown, the second ground planes 124 are pattern electroplated onto the first ground planes 122 using the same photoresist pattern mask that was used during the formation of the first ground planes. In other embodiments (not shown) the second ground planes 124 can also be formed in desired patterns over selected portions of the stainless steel stock 112' and/or first ground planes 122. Photolithography and other processes such as sputtering and vapor deposition can also be used to form and optionally pattern the second ground planes 124.

Insulating layer 116 can be formed over the second ground planes 124 and any exposed portions of stainless steel stock 112' as shown in FIGS. 8 and 8A-8C. In one embodiment of the invention the insulating layer 116 is formed by coating, curing and patterning a polyimide precursor. Other materials and processes are used in other embodiments. In the illustrated embodiment the insulating layer 116 extends across a width of the flexure 108 spanning both of the first ground planes 122 and the area between the first ground planes, but not the full width of the stainless steel stock 112'. In other embodiments (not shown), the insulating layer can take other configurations. Other processes can also be used to form the insulating layer 116.

Traces 114 are formed on the insulating layer 116. In one embodiment of the invention a seed layer of conductive material is sputtered onto the insulating layer 116 and patterned using photolithography and etching processes. The traces 114 are then electroplated onto the seed layer. Any conductive plating layer such as 123 (FIG. 5C) can then be plated onto the traces 114. Photolithography and other processes such as vapor deposition and chemical etching can also be used to form the traces 114 on the insulating layer 116. Cover layer 126 (FIG. 5) can be formed over the traces 114 using materials and processes such as those described above for forming the insulating layer 116.

Voids 118 and other structures in the stainless steel base layer 112 of flexure 108 are formed from the stainless steel stock 112' by photolithography and etching processes in one embodiment of the invention. By way of example, a mask (not shown) corresponding to the patterns of voids 118 can be formed on the side of stainless steel stock 112' opposite the insulating layer 116, and the stainless steel stock exposed to a chemical etchant. In one embodiment of the invention, the etchant used to remove the stainless steel stock 112' at voids 118 is not reactive to the material used for the second ground planes 124. In these embodiments the second ground plane 124 can be used as an etch stop during the manufacture of flexure 108, thereby enhancing the efficiency of the manufacturing process. In the embodiment described above that has a gold second ground planes 124, for example, the ground plane will function as an etch stop for an etching process using FeCl acid to form voids 118. In this embodiment where the first ground planes 122 are copper or copper alloy, the etchant will also remove (not shown) the first ground planes 122 at the location of the voids 118.

Figure 9:
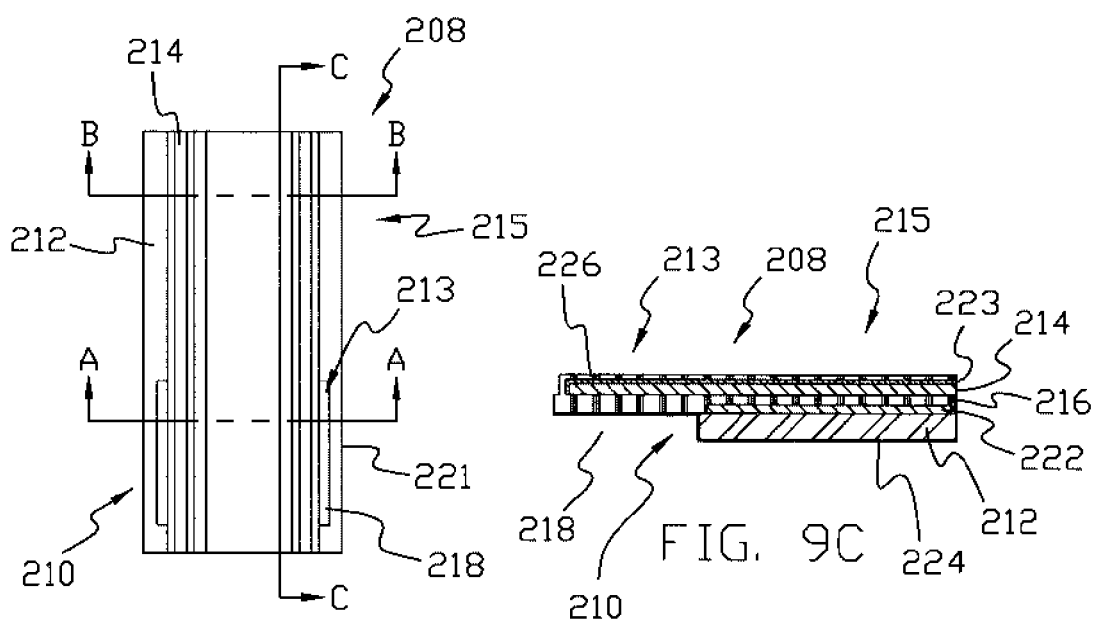
FIG. 9 is a top plan view of a portion of an integrated lead flexure in accordance with another embodiment of the invention.
Figure 9A:
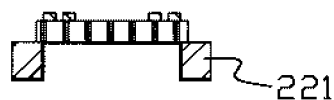
Figure 9B:
Figure 11:
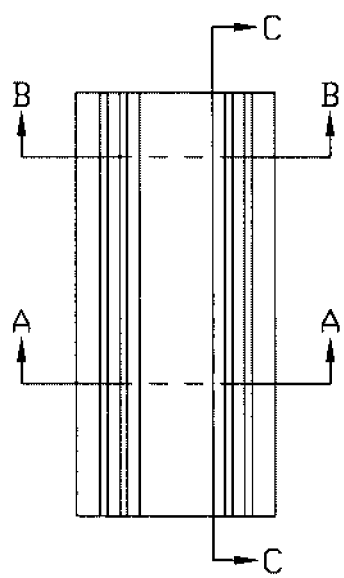
FIG. 11 is a top plan view of the integrated lead flexure portion shown in FIG. 10 following yet additional manufacturing steps in accordance with one embodiment of the invention.
Figure 11C:
FIGS. 11A, 11B and 11C are cross sectional views of the integrated lead flexure portion shown in FIG. 11, taken at section lines A-A, B-B and C-C in FIG. 11, respectively.
Figure 11A:
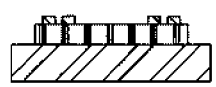
Figure 11B:

FIG. 9 is a top view of a portion of an integrated lead flexure 208 having a multiple layer, high conductivity ground plane structure 210 in accordance with one embodiment of the invention. FIGS. 9A, 9B and 9C are sectional views of the flexure 208 taken at lines A-A, B-B and C-C, respectively in FIG. 9. As shown, flexure 208 includes a stainless steel base layer 212, a plurality of leads or traces 214 and a dielectric or insulating layer 216 separating the traces from the base layer. The traces 214 extend between terminal pads (not shown) on the opposite ends of the flexure 208. The illustrated embodiment of flexure 208 has four traces 214 that are arranged in two groups of two traces each. As shown in FIG. 9C (but not in FIG. 9, 9A or 9B), a conductive plating layer 223 can be applied over the surfaces of the traces 214 extending from the insulating layer 216. A dielectric cover layer 226 can also be applied over the plated traces 214 and optionally over the insulating layer 216. Flexure 208 is configured to be mounted to a stainless steel or other conventional load beam (not shown) in a conventional manner.

One or more portions 215 of the flexure 208 have stainless steel base layer 212 below or backing the traces 214. One or more portions 213 of the flexure 208 (one is shown in FIGS. 9 and 9A-9C) have windows or voids 218 in the base layer 212 below portions of the traces 214. Voids 218 extend through the base layer 212. In the illustrated embodiment, void 218 is located between the outer edge portions 221 of the base layer 212. In other embodiments (not shown) voids 218 extend across the full width of the flexure 208, and no edge portions such as 221 remain. Voids 218 can be one of several "windows" in the flexure 208 (such as the holes in the Shiraishi et al. U.S. Pat. No. 6,891,700), or can extend for any desired length between the terminal pads (not shown) on the opposite ends of the traces, including on the gimbal region and tail of the flexure (not shown). Portions of the base layer 212 will remain to allow the flexure 208 to be welded or otherwise attached to a load beam (not shown).

Ground plane structure 210 includes patterned first conductive ground planes 222 on the stainless steel-backed portions 215 and a continuous second ground plane 224 over both the stainless steel backed portions 215 and the stainless steel void portions 213. The first conductive ground plane 222 is located on the stainless steel base layer 212, below the traces 214 and insulating layer 216, on the portions of the flexure 208 that do not have voids 218 in the base layer. The illustrated embodiment includes two transversely spaced first conductive ground planes 222, one below each of the two sets of traces 214. In the illustrated embodiment the second high conductivity ground plane 224 is located: (1) over the entire surface of the stainless steel base layer 212 opposite the insulating layer 216, including the edges of the base layer in the voids 218, and (2) over the surface of the insulating layer 216 in the voids 218 (i.e., the surface of the insulating layer opposite the traces 214).

FIGS. 10, 10A-10C, 11 and 11A-11C illustrate an additive process by which the flexure 208 can be fabricated. As shown in FIGS. 10 and 10A-10C, the first conductive ground planes 222 are formed at desired locations on stainless steel stock 212'. The ground planes are formed from copper or copper alloy in one embodiment. Other conductive metals or other materials are used in other embodiments. Photolithography and electroplating processes are used to form the first ground planes 222 in one embodiment. Other processes such as sputtering or vapor deposition are used in other embodiments.

Insulating layer 216 can be formed over the first ground planes 222 and exposed portions of stainless steel stock 212' as shown in FIGS. 11 and 11A-11C. In one embodiment of the invention the insulating layer 216 is formed by coating, curing and patterning a polyimide precursor. Other materials and processes are used in other embodiments. In the illustrated embodiment the insulating layer 216 extends across a width of the flexure 208 spanning both of the first ground planes 222 and the area between the first ground planes, but not the full width of the stainless steel stock 212'. In other embodiments (not shown), the insulating layer can take other configurations. Other processes can also be used to form the insulating layer 216.

Traces 214 are formed on the insulating layer 216. In one embodiment of the invention a seed layer of conductive material is sputtered onto the insulating layer 216 and patterned using photolithography and etching processes. The traces 214 are then electroplated onto the seed layer. Any conductive plating layer such as 223 (FIG. 9C) can then be plated onto the traces 214. Photolithography and other processes such as vapor deposition and chemical etching can also be used to form the traces 214 on the insulating layer 216. Cover layer 226 (FIG. 9C) can be formed over the traces 214 using materials and processes such as those described above for forming the insulating layer 216.

Voids 218 and other structures in the stainless steel base layer 212 of flexure 208 are formed from the stainless steel stock by photolithography and etching processes in one embodiment of the invention. By way of example, a mask (not shown) corresponding to the patterns of voids 218 can be formed on the side of stainless steel stock 212' opposite the insulating layer 216, and the stainless steel stock exposed to a chemical etchant.

The second ground plane 224 is then formed over the stainless steel base layer 212 and the portions of insulating layer 216 exposed within the voids 218 as shown in FIGS. 9 and 9A-9C. In one embodiment of the invention the second ground plane 224 is a layer of gold that is sputtered onto the surfaces of the stainless steel base layer 212 and insulating layer 216. In the one embodiment of the invention the second ground plane 224 is sputtered onto the entire surface of the base layer 212 and the exposed portions of the insulating layer 216. In other embodiments the second ground plane can be applied in desired patterns over only selected portions of the base layer 212 and the exposed portions of the insulating layer 216. Photolithography and other processes such as electroplating can also be used to form and optionally pattern the second ground plane 224.

Ground plane structures of the type described herein can be formed at any desired location on a flexure between the terminal pads at the tail and slider mounting region of the flexure. These ground planes offer important advantages. For example, they can reduce the overall impedance of the traces between the terminal pads, as well as make the impedance more uniform along the length of the traces. Signal transmission performance capabilities of the flexure such as peak current capacity, bandwidth and rise times are thereby enhanced. These advantages are achieved without detrimental impact to the mechanical functionality of the flexure. Furthermore, these structures can also be manufactured by efficient processes.

Although the present invention has been described with reference to preferred embodiments, those skilled in the art will recognize that changes can be made in form and detail without departing from the spirit and scope of the invention. For example, although described in connection with an integrated lead flexure for attachment to a load beam, the invention can be used in connection with other suspension components such as an integrated lead suspension.

What is claimed is:

1. An integrated lead suspension component, including:
   an insulating layer;
   a plurality of traces on the insulating layer;
   a stainless steel base layer on the side of the insulating layer opposite the traces, the stainless steel base layer including one or more void portions with voids in the base layer opposite the insulating layer from the traces and one or more backed portions with the base layer backing the traces;
   one or more first conductive ground planes between the stainless steel base layer and the insulating layer opposite insulating layer from at least portions of the traces at the backed portions; and
   one or more second conductive ground plane portions opposite the insulating layer from the traces at the void portions and backed portions of the stainless steel base layer.

2. The integrated lead component of claim 1 wherein the second conductive ground planes are continuous.

3. The integrated lead component of claim 1 and including a plurality of discontinuous second conductive ground planes.

4. An integrated lead suspension component, including:
   an insulating layer;
   a plurality of traces on the insulating layer;
   a stainless steel base layer on the side of the insulating layer opposite the traces, the stainless steel base layer including one or more void portions with voids in the base layer opposite the insulating layer from the traces and one or more backed portions with the base layer backing the traces;
   one or more first conductive ground planes between the stainless steel base layer and the insulating layer opposite the insulating layer from at least portions of the traces at the backed portions of the stainless steel base layer; and
   one or more continuous second conductive ground planes opposite the insulating layer from the traces at the void portions and backed portions of the stainless steel base layer.

5. The integrated lead suspension component of claim 4 wherein the second conductive ground planes are between the first conductive ground planes and the insulating layer at the backed portions of the stainless steel layer.

6. An integrated lead suspension component, including:
   an insulating layer;
   a plurality of traces on the insulating layer;
   a stainless steel base layer on the side of the insulating layer opposite the traces, the stainless steel base layer including one or more void portions with voids in the base layer opposite the insulating layer from the traces and one or more backed portions with the base layer backing the traces;
   one or more first conductive ground planes between the stainless steel base layer and the insulating layer opposite the insulating layer from at least portions of the traces at the backed portions of the stainless steel layer; and
   one or more discontinuous second conductive ground planes opposite the insulating layer from the traces at the void portions and backed portions of the stainless steel base layer.

7. The integrated lead suspension component of claim 6 wherein the second conductive ground planes are between the first conductive ground planes and the insulating layer at the backed portions of the stainless steel layer.

8. An integrated lead suspension component, including:
   an insulating layer;
   a plurality of traces on the insulating layer;
   a stainless steel base layer on the side of the insulating layer opposite the traces, the stainless steel base layer including one or more void portions with voids in the base layer opposite the insulating from the traces and one or more backed portions with the base layer backing the traces;
   one or more first conductive ground planes between the stainless steel base layer and the insulating layer opposite the insulating layer from at least portions of the traces at the backed portions of the stainless steel layer; and
   one or more second conductive ground plane portions opposite the insulating layer from the traces at the void portions of the stainless steel base layer and on the side of the stainless steel base layer opposite the first conductive ground planes at the backed portions of the stainless steel base layer.

9. The integrated lead suspension component of claim 8 wherein the second conductive ground plane is continuous between the void portions and backed portions of the stainless steel base layer.

* * * * *